United States Patent [19]
Ohashi

[11] Patent Number: 6,126,467
[45] Date of Patent: Oct. 3, 2000

[54] SOCKET FOR ELECTRICAL PARTS

[75] Inventor: Yoshiyuki Ohashi, Kawaguchi, Japan

[73] Assignee: Enplas Corporation, Japan

[21] Appl. No.: 09/359,066

[22] Filed: Jul. 21, 1999

[30] Foreign Application Priority Data

| Jul. 22, 1998 | [JP] | Japan | 10-223676 |
| Dec. 18, 1998 | [JP] | Japan | 10-360650 |
| Dec. 25, 1998 | [JP] | Japan | 10-369388 |
| Dec. 28, 1998 | [JP] | Japan | 10-373143 |

[51] Int. Cl.$^7$ .................................................. H01R 11/22
[52] U.S. Cl. ........................................... 439/268; 439/266
[58] Field of Search ................................. 439/268, 266, 439/263, 264, 259, 330, 331

[56] References Cited

U.S. PATENT DOCUMENTS

| 5,611,705 | 3/1997 | Plaff | 439/266 |
| 5,800,194 | 9/1998 | Yamagishi | 439/266 |
| 6,042,409 | 4/2000 | Ohshima | 439/268 |
| 6,050,836 | 4/2000 | Tohyama | 439/266 |

*Primary Examiner*—Khiem Nguyen
*Assistant Examiner*—Son V. Nguyen
*Attorney, Agent, or Firm*—Fish & Richardson P.C.

[57] ABSTRACT

A socket for an electrical part includes a socket body provided with a mount surface portion on which an electrical part having terminals are mounted, number of contact pins disposed to the socket body and having contact portions so as to be contacted to or separated from the terminals of the electrical part, respectively, a movable plate disposed to the socket body to be movable, the contact portions of the contact pins being contacted or separated from the terminals of the electrical part through movement of the movable plate, and an operation member disposed to the socket body and adapted to move the movable plate. Each of the contact pins is provided with a pair of fulcrum portions, a pair of clamping pieces which perform pivotal motion about the fulcrum portions, a pair of contact portions formed, at front end portions thereof, to the clamping pieces so as to establish electrical connection between the contact pin and the terminal when the terminal is clamped between the contact portions, and a pair of press portions to be pressed by the movable plate including force acting portions on which pressing force of the movable plate is applied. The contact portions and the force acting portions of the contact pin are formed to positions opposite to each other with respect to the fulcrum portions.

8 Claims, 7 Drawing Sheets

SOCKET FOR ELECTRICAL PARTS

BACKGROUND OF THE INVENTION

1. Field of the Invention

The present invention relates to a socket for an electrical part for detachably holding an electrical part such as semiconductor device, called hereinlater "IC package", particularly having improved structures of a contact pin separated from or contacted to the electrical part and a movable plate for displacing the contact pin.

2. Prior Art of the Invention

In this art field, there is known an IC socket as "socket for an electrical part" for detachably holding an IC package as "electrical part" such as disclosed in the Japanese Utility Model Publication No. HEI 6-44050.

To such known IC socket, a number of contact pins are arranged, and as shown in FIGS. 7A and 7B, in which only one contact pin 1 is shown, the contact pin 1 is formed with a pair of clamping pieces 1a each being formed with a contact portion 1b which is contacted to and separated from a connection pin 2 of the IC package. The contact pin 1 is also formed with press portions 1c pressed by a cam portion 3a formed to a movable plate 3. The cam portion 3a is inserted into a pair of press portions 1c thereby to lower the movable plate 3 in a state shown in FIG. 7A. When the movable plate 3 is moved downward, the paired press portions 1c are widened, and under this state, the connection pin 2 is inserted into a space between the paired contact portions 1b through an insertion hole 4a formed to a cover 4.

With reference to FIG. 7B, when the movable plate 3 is moved upward, the cam portion 3a is also moved upward and the connection pin 2 is then clamped by the paired contact portions 1b thereby to establish an electrical connection.

According to the structure mentioned above, the IC package can be mounted to or dismounted from the IC socket without using any insertion or withdrawal force only by moving up and down the movable plate 3 after projecting the IC package, thus improving working efficiency.

However, in such known structure, since a pair of contact portions 1b are widened by inserting the cam portion 3a of the movable plate 3 into the space between the paired press portions 1c of each contact pin 1, it is necessary to insert the cam portion 3a into the space between the paired press portions 1c at the time of arranging the contact pin 1 and the movable plate 3, which results in less assembling workability and in increasing of the operating force of the movable plate 3, thus being inconvenient and providing a problem.

SUMMARY OF THE INVENTION

An object of the present invention is to substantially eliminate defects or drawbacks encountered in the prior art mentioned above and to provide a socket for electrical parts capable of improving an assembling workability of parts or elements such as movable plate and reducing working force thereof with reduced manufacturing cost.

Another object of the present invention is to provide a socket for electrical parts having a structure capable of making wide an opening distance between both contact portions of each contact pin even with less moving amount of the movable plate.

A further object of the present invention is to provide a socket for electrical parts having a structure capable of reducing an increasing of the working force of the movable plate in association with an opening amount of the contact portions.

A still further object of the present invention is to provide a socket for electrical parts capable of easily opening and widening both the contact portions by smoothly applying a force to clamping pieces of the contact pin.

These and other objects can be achieved according to the present invention by providing a socket for an electrical part comprising:

a socket body provided with a mount surface portion on which an electrical part having terminals are mounted;

a number of contact pins disposed to the socket body and having contact portions so as to be contacted to or separated from the terminals of the electrical part, respectively;

a movable plate disposed to the socket body to be movable, the contact portions of the contact pins being contacted or separated from the terminals of the electrical part through movement of the movable plate; and an operation member disposed to the socket body and adapted to move the movable plate, each of the contact pins being provided with a pair of fulcrum portions, a pair of clamping pieces which perform pivotal motion about the fulcrum portions, a pair of contact portions formed, at front end portions thereof, to the clamping pieces so as to establish electrical connection between the contact pin and the terminal when the terminal is clamped between the contact portions, and a pair of press portions to be pressed by the movable plate including force acting portions on which pressing force of the movable plate is applied, wherein when the force acting portions are pressed, the clamping pieces are pivoted about the fulcrum portions thereby to open the contact portions and the contact portions and said force acting portions of the contact pin are formed to positions opposite to each other with respect to said fulcrum portions.

In preferred embodiments, in each of the contact pins, a distance between the contact portions and the fulcrum portions is made larger than a distance between the force acting portions and the fulcrum portions.

The movable plate is movable in a direction perpendicular to the mount surface portion of the socket body and when the movable plate is moved in a direction apart from the mount surface portion, the contact portions of the contact pin is opened. When the movable plate is moved in the direction apart from the mount surface portion, the force acting portion of the contact pin is set to be apart from the fulcrum portions. The press portion to be pressed by the movable plate is formed so as to provide a tapered shape widened towards end portions opposite to the front end portions to which contact portions are formed.

The press portions to be pressed by the movable plate may have shapes such that a distance between the paired press portions of each of the contact pins is made narrow towards the end portion opposite to the front end portion of the contact pin at which the contact portions are formed. The movable plate is movable in a direction perpendicular to the mount surface portion of the socket body and when the movable plate is moved in a direction approaching to the mount surface portion, the contact portions of the contact pin is opened.

The contact pins are formed through a punching working by means of press from a sheet of plate having an elastic property.

According to the characteristic features of the present invention mentioned above, since the contact pin is formed such that the contact portions and the force acting portions are positioned to be opposite with respect to the fulcrum portions (that is, which are positioned between the contact portions and the force acting portions), it is not necessary to insert a cam portion between the closed contact portions at the time of arrangement of the movable plate as in the prior art, so that the assembling workability can be improved.

Furthermore, in each of the contact pins, since the distance between the contact portions and the fulcrum portions is made larger than the distance between the force acting portions and the fulcrum portions, the contact portions can be largely widened even in a small displacement of the movable plate.

Still furthermore, when the movable plate is moved in the direction apart from the mount surface portion, the force acting portion of the contact pin is set to be apart from the fulcrum portions, so that the increasing of the operating force of the movable plate in accordance with the opening degree of the contact portions of the contact pin can be effectively reduced.

Still furthermore, the press portion to be pressed by the movable plate is formed so as to provide a tapered shape widened towards end portions opposite to the front end portions to which contact portions are formed, so that the movable plate can be easily slid along the tapered portions, and hence, the pressing force is smoothly applied to the clamping pieces of the contact pin, thus easily opening the contact portions thereof.

The further nature and characteristic features will be made more clear from the following descriptions made with reference to the accompanying drawings.

BRIEF DESCRIPTION OF THE DRAWINGS

In the accompanying drawings:

FIG. 5 includes sectional views in operative states of the contact pin, in which

DESCRIPTION OF THE PREFERRED EMBODIMENTS

Figure 1:
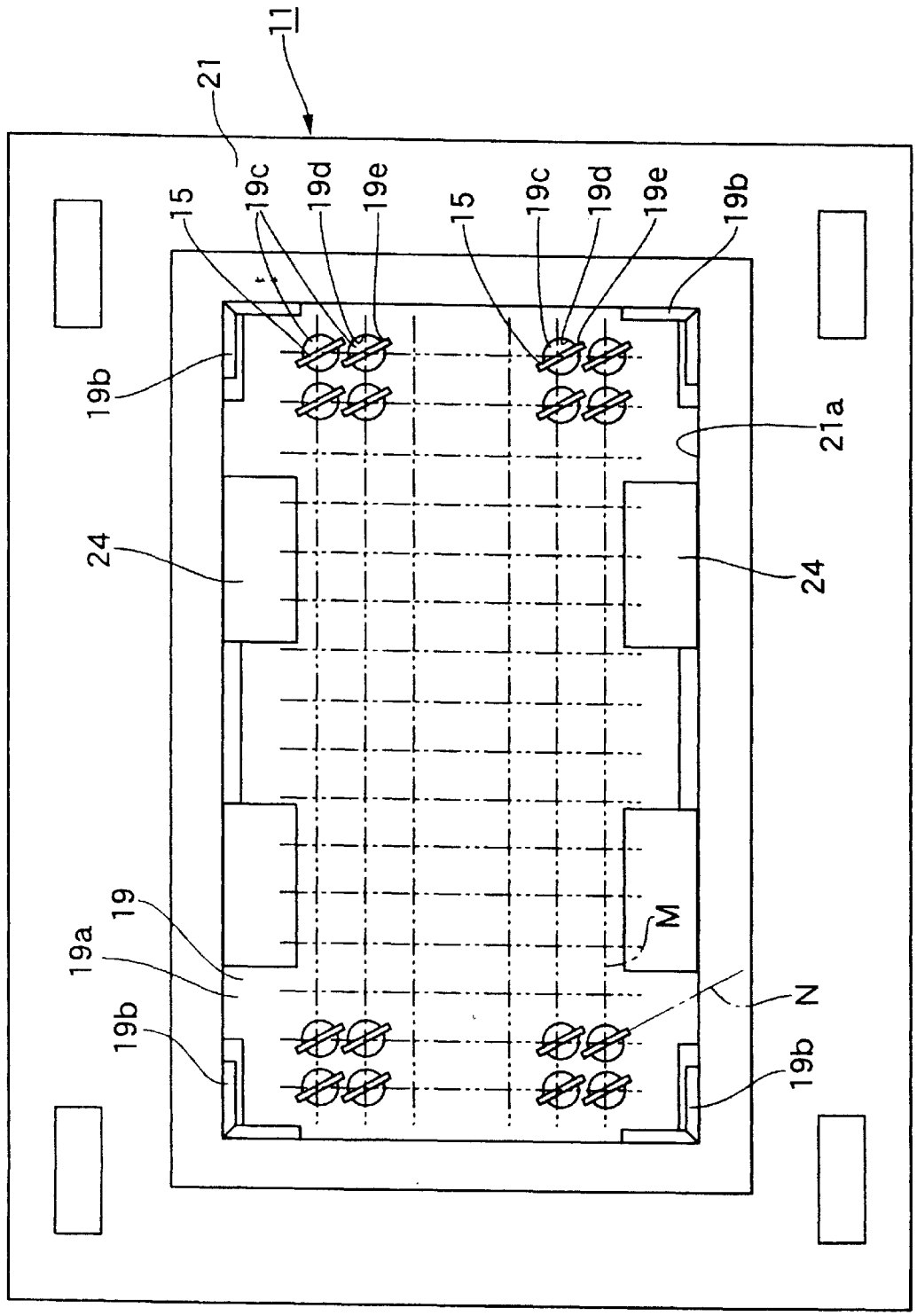
FIG. 1 is a plan view of an IC socket as a socket for electrical parts according to one embodiment of the present invention.

Preferred embodiments of the present invention will be described hereunder with reference to the accompanying drawings.

[First Embodiment]

A first embodiment of the present invention is shown in FIGS. 1 to 5C, in which reference numeral 11 denotes an IC socket 11 as "socket for electrical parts" which performs electrical connection between a printed circuit board, not shown, of a measuring device such as tester and a solder ball 12b as "terminal" of an IC package 12 as "electrical part" for carrying out a performance test of the IC package 12.

Figure 5A:
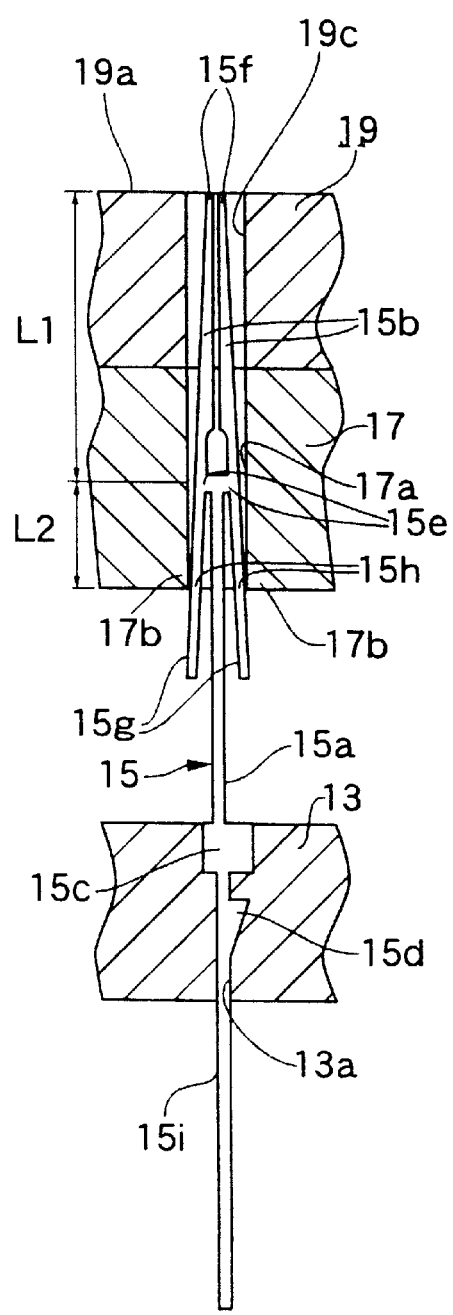
FIG. 5A shows a state that both the contact portions of the contact pin is closed.
Figure 5B:
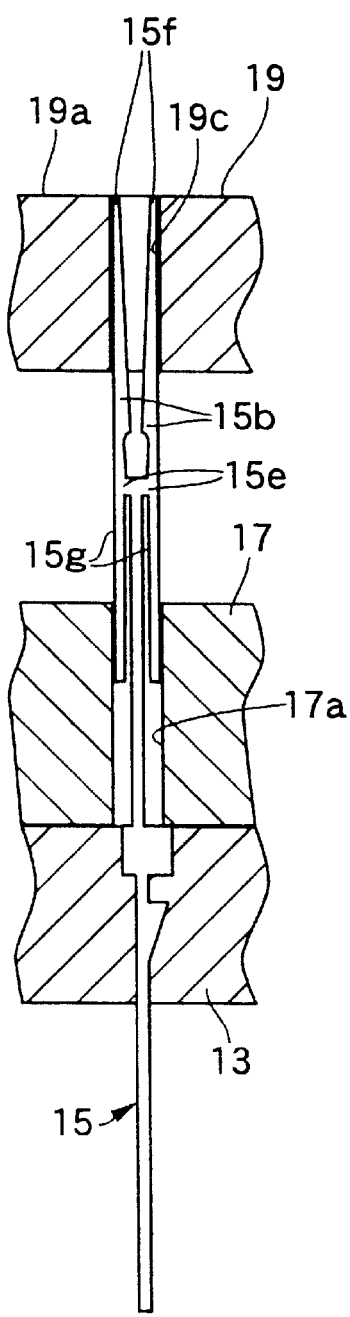
FIG. 5B shows a state that both the contact portions are opened.
Figure 5C:
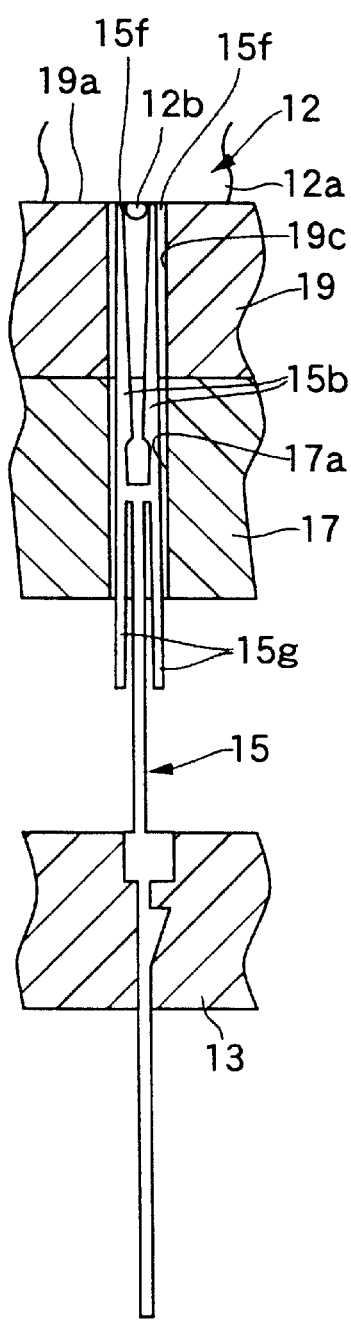
FIG. 5C shows a state that a solder ball, as terminal, of an IC package is clamped between both the contact portions.

The IC package 12 is of so-called a BGA (Ball Grid Alley) structure, in which a number of spherical solder balls 12b are arranged to a lower surface of an IC package body 12a having, for example, a rectangular shape, so as to project therefrom, as shown in FIG. 5C, in shape of matrix.

The IC socket 11 generally has a socket body 13 mounted to a printed circuit board, not shown, and a number of contact pins 15 which are contacted to or separated from the solder balls 12b, respectively, are arranged to the socket body 13. A movable plate 17 for displacing (moving) these contact pins 15 are also mounted to the socket body 13. Furthermore, an upper plate 19 is also mounted fixedly to the socket body 13 above the movable plate 17, and the movable plate 17 is driven and moved up and down by an upper operation member 21 which is also mounted to the socket body 13.

The contact pin 15 is formed by a punching working of a press from a sheet of plate having an elastic or springy property and a good electrical conductivity.

More in detail, as shown FIGS. 5A to 5C, each of the contact pin 15 is composed of an elongated plate-like base portion 15a press-fitted into the socket body 13 and fixed thereto, a pair of clamping pieces 15b formed to the upper portion of the base portion 15a and a lead portion 15i projecting downward, as viewed, from the base portion 15a over the lower surface of the socket body 13 and inserted into and then soldered to an insertion hole formed to the printed circuit board, not shown. A number of contact pins 15, each having the above structure, are mounted to the socket body 13.

The base portion 15a is formed with a stopper portion 15c press-fitted into a press-in hole 13a of the socket body 13 so as to prevent the downward movement thereof and an engaging portion 15d which bites an inner wall of the press-in hole 13a so as to prevent the contact pin 15 from coming off.

Furthermore, the paired clamping pieces 15b have a pair of fulcrum portions 15e extending in a lateral direction, as viewed, from the upper end portion of the base portion 15a, and when the fulcrum portions 15e are elastically deformed, the paired clamping pieces 15b are pivoted thereabout. A pair of contact portions 15f are formed to the upper, i.e. front, end portions of the clamping pieces 15b so as to be contacted to or separated from the side portions of the solder ball 12b of the IC package 12 thereby to clamp the solder ball 12b therebetween. The clamping piece 15b is made gradually thin from the base portion 15a towards the contact portion 15f. The clamping pieces 15b also have a pair of press portions 15g which extends downward from the lower side of the base portion 15a and are depressed by the movable plate 17 when the movable plate is moved downward. The press portions 15g have force acting portions 15h to which the movable plate 17 abuts. Although these force acting portions 15h are displaced by the movement of the movable plate 17, they are always positioned below the fulcrum portions 15e so that the force acting portions 15h and the contact portions 15f are always positioned opposite to each other on both sides of the fulcrum portions 15e and a distance L1 between the contact portions 15f and the fulcrum portions 15e is shorter than a distance L2 between the force acting portions 15h and the fulcrum portions 15e. Furthermore, as mentioned hereinlater, the press portions 15g to be depressed by pressing portions 17b of the movable plate 17 are formed to be tapered so as to be widened towards the downward direction.

The contact pins 15, each having the structure mentioned above in detail, are arranged in the matrix shape as shown in FIG. 1 in a manner such that displacing direction N of the contact portions 15f of the respective contact pins 15 have a predetermined inclination with respect to the arrangement direction M of the contact pins 15.

Figure 2:
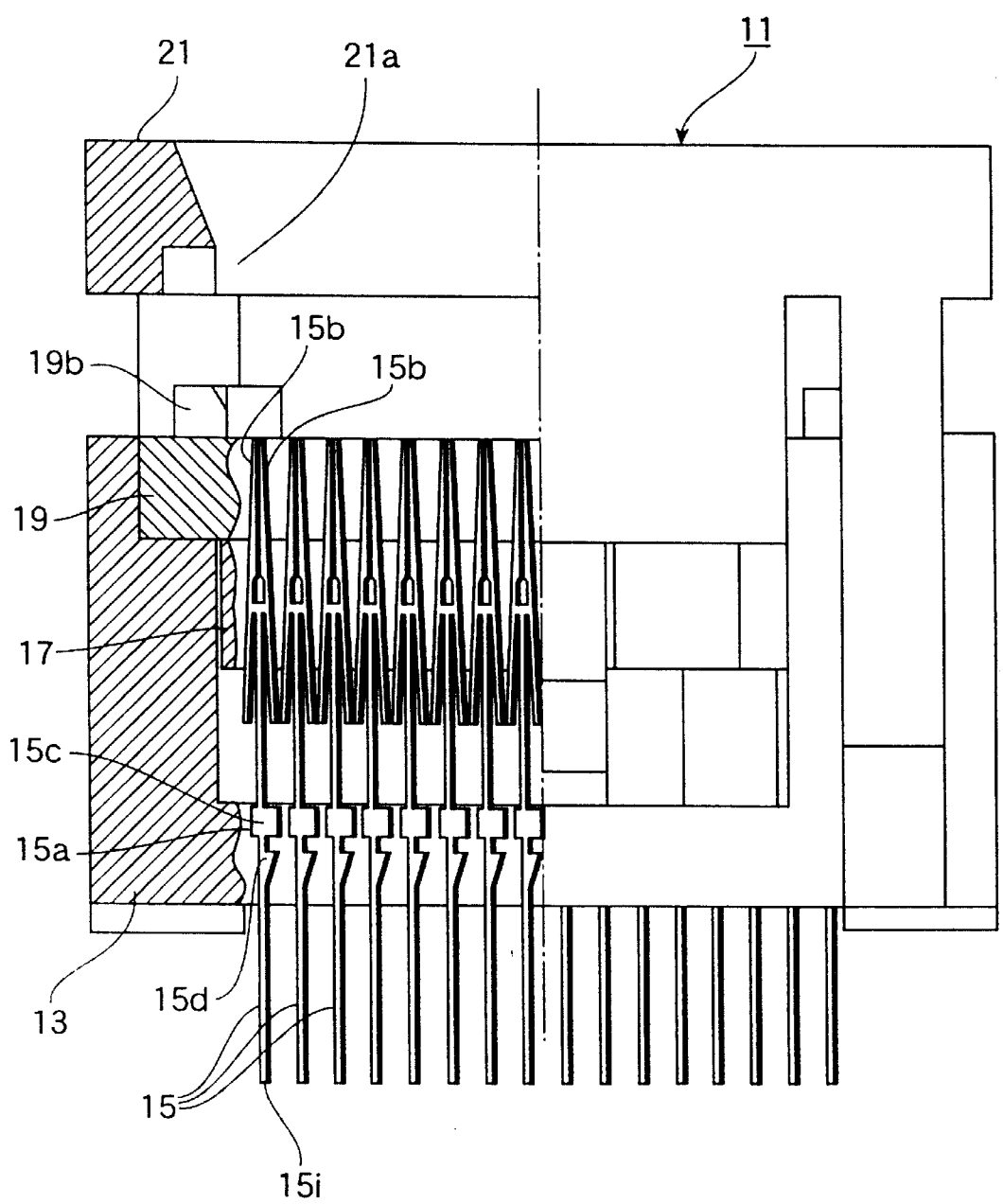
FIG. 2 is a front view, left half in section, of the IC socket shown in FIG. 1.

Incidentally, the movable plate 17 is mounted to the socket body 13 to be vertically movable (in a direction perpendicular to a mount surface portion 19a of the upper plate 19, mentioned hereinlater) as shown in FIG. 2 and is urged upward by means of spring, not shown, and lowered by the depressing force of the upper operation member 21.

Figure 7A:
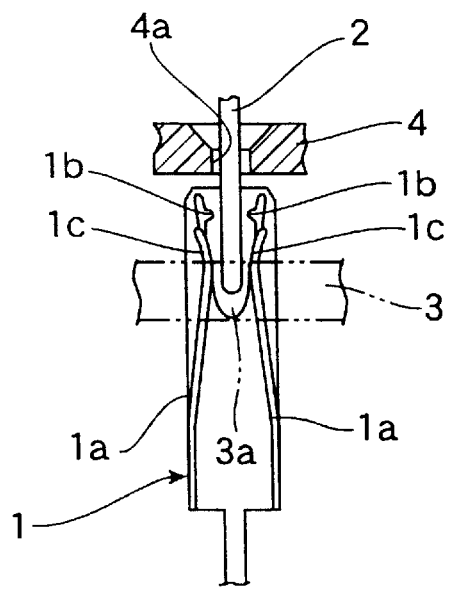
FIG. 7 represents a known structure and includes FIG. 7A being a sectional view showing a state that both contact portions of a contact pin is opened and FIG. 7B being a sectional view showing a state that a connection pin is clamped between both the contact portions of the contact pin.
Figure 7B:
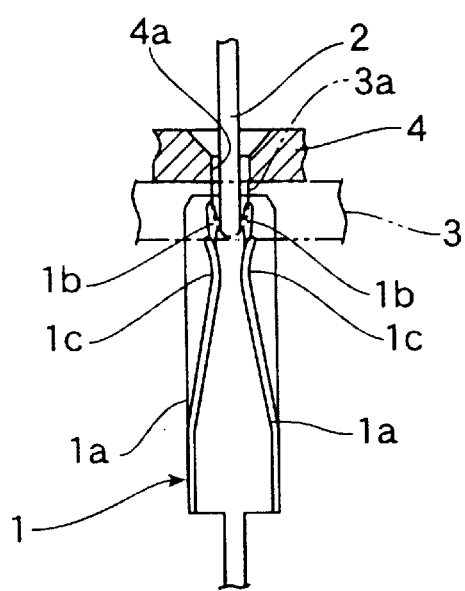

The movable plate 17 is formed with through holes 17a, as shown in FIGS. 7A to 7C, through which the contact pins 15 are inserted such that the press portions 15g of the contact pins 15 are pressed by pressing portions 17b of the through holes 17a. When the press portions 15g are pressed, both the clamping pieces 15b of each of the contact pins 15 are pivoted about the fulcrums 15e thereby to open the contact portions 15f.

The upper plate 19 is formed with the mount surface portion 19a on which the IC package 12 is mounted and provided with guide portions 19b at portions corresponding to the respective corner portions of the rectangular IC package body 12a, as shown in FIG. 1, so as to locate the IC package 12 at the predetermined position. Furthermore, the upper plate 19 is formed with insertion holes 19c into which the paired contact portions 15f and the solder balls 12b are inserted. As shown in FIG. 1, the insertion hole 19c is formed with a circular portion 19d into which the solder ball 12b is inserted and a slit portion 19e into which the contact portions 15f are inserted.

Figure 3:
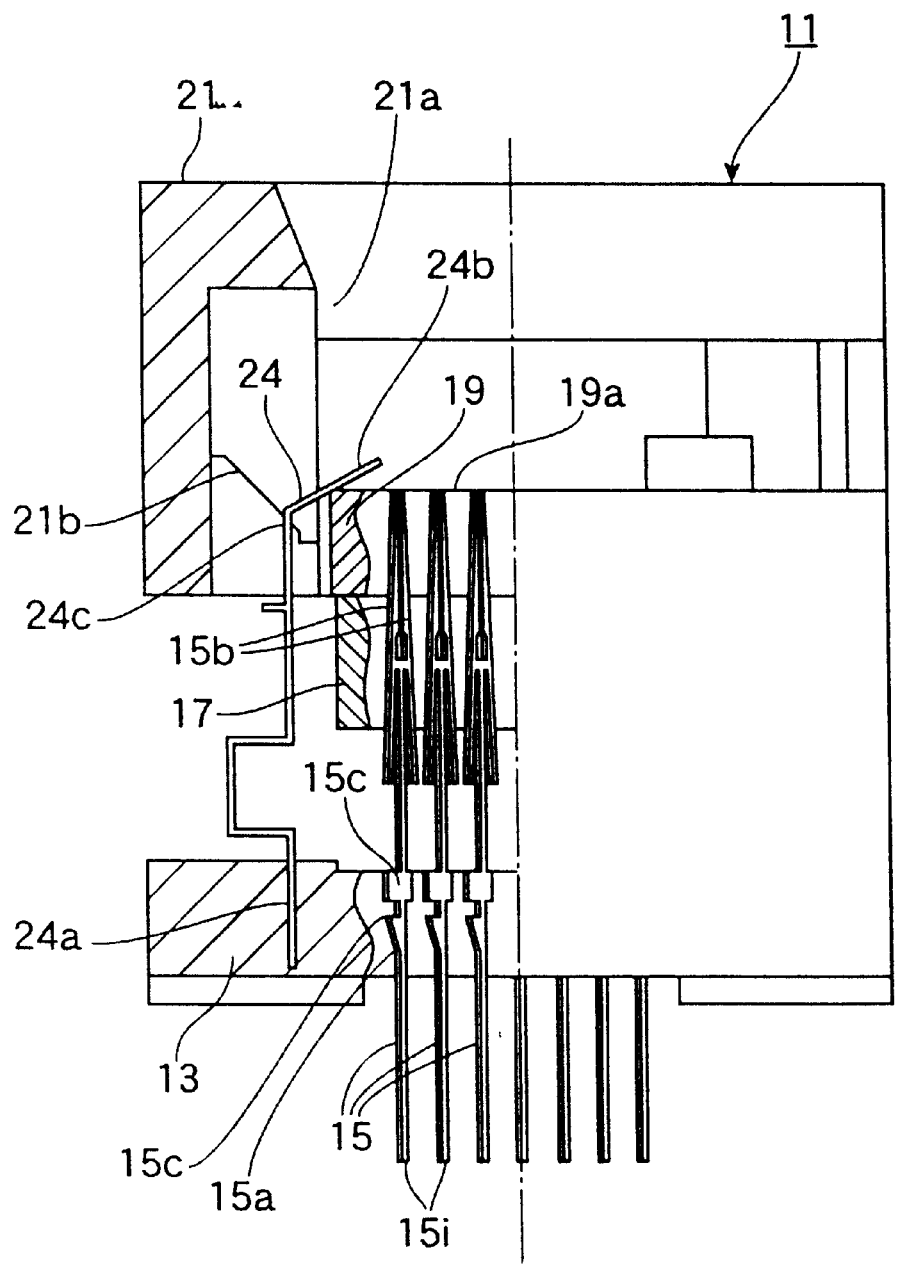
FIG. 3 is a right side view, half in section, of the IC socket of FIG. 1.
Figure 4:
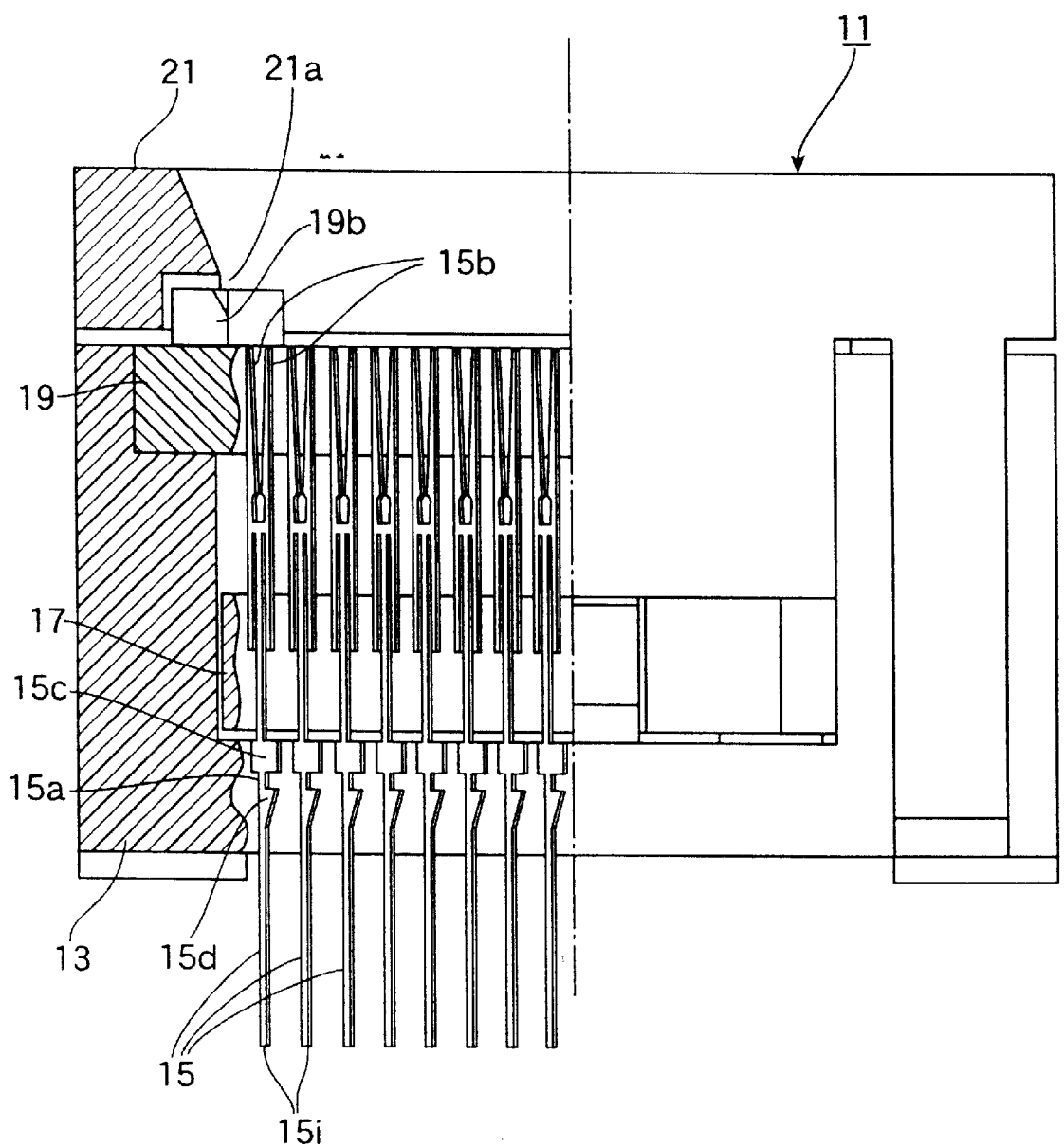
FIG. 4 is a front view corresponding to FIG. 2, in which both contact portions of each of contact pins are opened.

Furthermore, the upper operation member 21 has a large opening 21a, as shown in FIG. 1, having a size allowing the IC package 12 to be inserted, and the IC package 12 is inserted through this opening 21a and then mounted on the predetermined position of the mount surface portion 19a of the upper plate 19. The upper operation member 21 is arranged, as shown in FIG. 3, to be vertically movable with respect to the socket body 13 in a usable state and urged upward by means of spring, not shown. When the upper operation member 21 moved to the uppermost position, an engaging claw, not shown, thereof is engaged with an engaging portion of the socket body 13 thereby to provide the upper operation member 21 from coming off.

The upper operation member 21 is formed with cam portions 21b for rotating latches 24 which will be mentioned hereinlater.

The latches 24 are formed of a plate member having an elastic or springy property and, as shown in FIG. 3, the lower end portions thereof are fixed to the socket body 13 and the upper end portions thereof are bent thereby to form pressing portions 24b to depress the peripheral edge portion of the IC package 12. When the upper operation member 21 is lowered, the cam portions 21b press portions 24b to be pressed, which are hence elastically deformed, whereby the press portions 24b are retired from the IC package setting position.

The IC socket of the structure mentioned above will operate in the following manner.

When the IC package 12 is set to the IC socket 11, the upper operation member 21 is first depressed downward and, accordingly, the movable plate 17 is depressed and moved downward against the urging force of the spring. According to the lowering motion of the movable plate 17, the press portions 15g of both the clamping pieces 15b of the contact pins 15 are pressed by the pressing portions 17b of the movable plate 17 thereby to rotate pivotally both the clamping pieces 15b about the respective fulcrum portions 15e, thus opening the paired contact portions 15f, respectively, as shown in FIG. 5B.

At substantially the same time, the press portions 24c of the latches 24 are pressed by the cam portions 21b of the upper operation member 21 and then elastically deformed, and the press portions 24b are displaced to positions retired from the IC package insertion area.

The IC package 12 is guided and mounted to the predetermined position on the mount surface portion 19a of the upper plate 19, and at this state, the solder balls 12b of the IC package 12 are inserted each into the space between the opened paired contact portions 15f with non-contacting state.

Thereafter, when the pressing force for lowering the upper operation member 21 is released, the upper operation member 21 is moved upward by the urging force of the spring, the movable plate 17 is also moved upward by means of spring, and the latches 24 are displaced in the clockwise direction in FIG. 3 by the self elastic property.

When the movable plate 17 is moved upward, the pressing force of the pressing portions 17b against the press portions 15g of the contact pin 15 is released and the paired contact portions 15f of each of the contact pins 15 are closed, i.e. moved in a width narrowing direction, thereby to clamp the solder ball 12b between both the contact portions 15f as shown in FIG. 5C. According to such operation, the electrical connection between the solder balls 12b of the IC package 12 and the printed circuit board can be realized.

When the IC package 12 is dismounted, the upper operation member 21 is lowered thereby to separate the paired contact portions 15f from the solder ball 12b of the IC package 12, so that the IC package 12 can be easily removed with a pulling force weaker than the pulling force for removing the solder ball 12b in the clamped state.

According to the structure mentioned above, since the pressing portions 17b of the movable plate 17, which operates to open or close the contact portions 15f, are not inserted into spaces between the respective paired contact portions 15f of the contact pins 15, it is not necessary to insert or fit the cam portions between the paired contact portions 15f now in the closed state at the initial arrangement of the movable plate 17. This fact is made possible from the arrangement that the paired contact portions 15f and the force acting portions 15h are positioned opposite to each other with respect to the fulcrum portions 15e. For example, in the case where the contact portions 15f and the force acting points 15h are positioned on the same side with respect to the fulcrum portions 15e, the contact portions 15f are not easily opened though they are closed even by pushing the force acting portions 15h.

Furthermore, since the distance L2 between the force acting portion 15h and the fulcrum portion 15e is made shorter than the distance L1 between the contact portion 15f and the fulcrum portion 15e, the paired contact portions 15f can be easily opened even if the displacement of the force acting portions 15h be made small, that is, even if the moving amount of the movable plate 17 be made small.

Still furthermore, since, when the movable plate 17 is lowered (when the movable plate 17 is moved in a direction apart from the mount surface portion 19a), the force acting portions 15h of the contact pin 15 are set so as to be separated from the fulcrum portions 15e, the increasing of the operating force of the movable plate 17 can be reduced. That is, in the case where the force acting portions 15h are set to be always constant, although the operating force of the movable plate 17 is increased in proportion to the opening degree of the paired contact portions 15f, the positions of the force acting portions 15h are separated from the fulcrum portions 15e, so that the increasing of the operating force of the movable plate 17 can be hence reduced.

Still furthermore, since the portions to be pressed (i.e. press portions 15g) of the contact pin 15 pressed by the pressing portions 17b of the movable plate 17 are formed to be tapered, the pressing portions 17b smoothly slide along the tapered surface of the press portions 15g, thus making small the pressing force.

Still furthermore, since the contact pins 15 can be manufactured from a sheet of plate, for example, only by the punching working of the press, thus being economical in cost.

[Second Embodiment]

Figure 6:
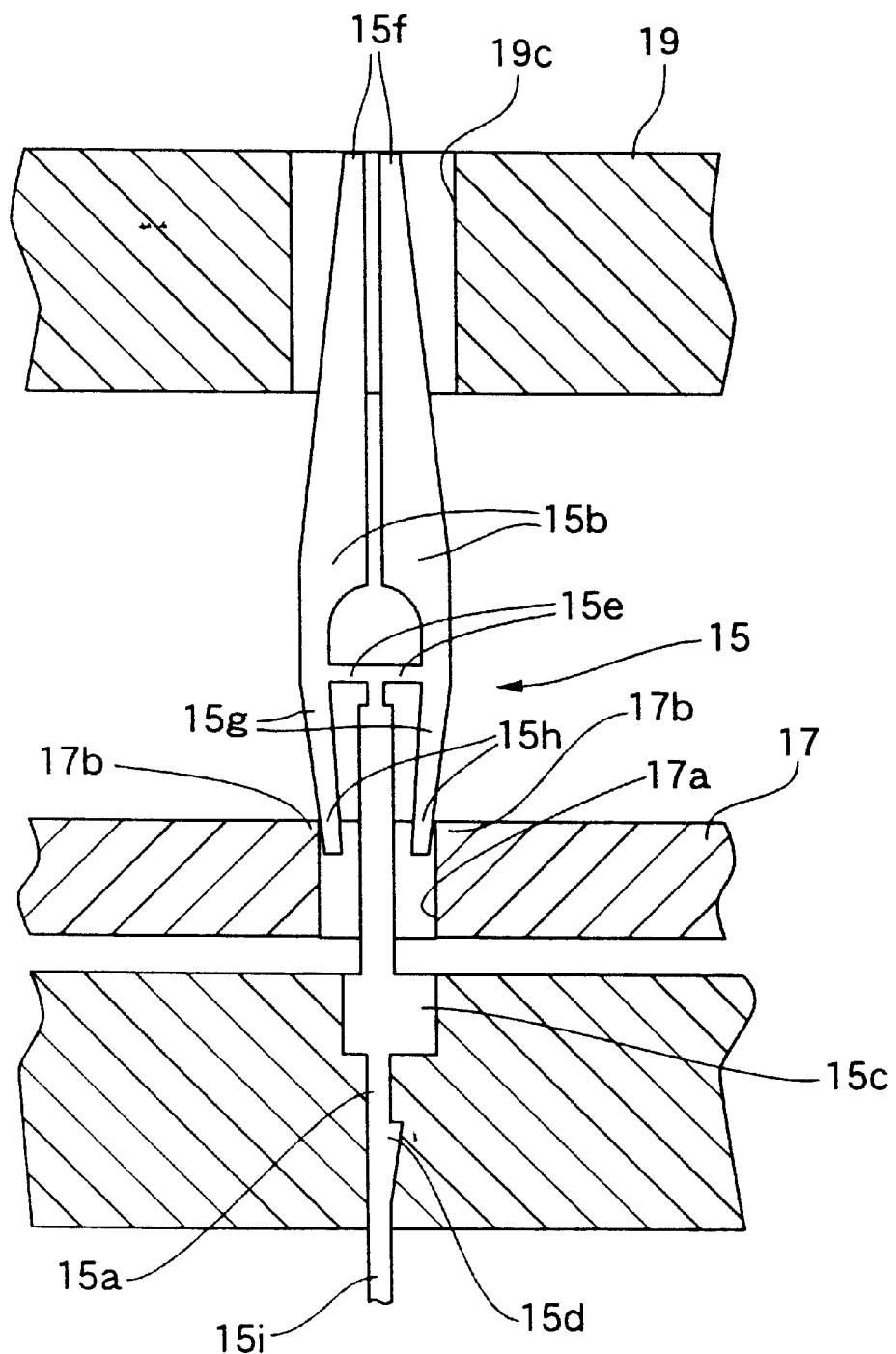
FIG. 6 is a sectional view corresponding to FIG. 5A according to another embodiment of the present invention.

FIG. 6 represents a second embodiment of the present invention, which differs from the first embodiment in the shape of the paired contact portions 15f of the respective contact pins 15 in a manner that the distance between the paired press portions 15g is made small (narrow), and in this second embodiment, when the movable plate 17 is moved upward (in a direction approaching the mount surface portion 19a), the paired contact portions 15f are opened. According to the above structure, the movable plate 17 and so on can be easily assembled, and moreover, the contact portions 15f can be opened widely even by the small moving amount of the movable plate 17.

It is further noted that the present invention is not limited to the described embodiments and many other changes and modifications may be made without departing from the scope of the appended claims.

For example, in the above embodiments, although the present invention is applied to the described IC socket 11 as "socket for electrical parts", it is a matter of course that the present invention is not limited to the IC socket and is applicable to other devices. Further, in the above embodiments, the present invention is applied to the BGA type IC package, but it may be possible to apply the present invention to a PGA (Pin Grid Alley) type IC package. Furthermore, in the described embodiments, although both the paired contact portions 15f of each of the contact pins 15 are opened or closed by vertically moving the movable plate 17, the present invention is not limited to such embodiments and may adopts a modification in which both the contact portions of the contact pins are opened or closed by acting a force to the force acting points through horizontal movement of the movable plate. Still furthermore, the mount surface portion 19a may be formed to the socket body 13, and in such example, the upper plate 19 will be eliminated.

What is claimed is:

1. A socket for an electrical part comprising:

a socket body provided with a mount surface portion on which an electrical part having terminals are mounted;

a number of contact pins disposed to the socket body and having contact portions so as to be contacted to or separated from the terminals of the electrical part, respectively;

a movable plate disposed to the socket body to be movable, said contact portions of the contact pins being contacted or separated from the terminals of the electrical part through movement of the movable plate; and an operation member disposed to the socket body and adapted to move said movable plate, each of said contact pins being provided with a pair of fulcrum portions, a pair of clamping pieces which perform pivotal motion about the fulcrum portions, a pair of contact portions formed, at front end portions thereof, to the clamping pieces so as to establish electrical connection between the contact pin and the terminal when the terminal is clamped between the contact portions, and a pair of press portions to be pressed by the movable plate including force acting portions on which pressing force of the movable plate is applied, wherein when said force acting portions are pressed, said clamping pieces are pivoted about the fulcrum portions thereby to open said contact portions, and said contact portions and said force acting portions of the contact pin are formed to positions opposite to each other with respect to said fulcrum portions.

2. A socket for an electrical part according to claim 1, wherein, in each of said contact pins, a distance between said contact portions and said fulcrum portions is made larger than a distance between said force acting portions and said fulcrum portions.

3. A socket for an electrical part according to claim 1, wherein said movable plate is movable in a direction perpendicular to said mount surface portion of the socket body and when the movable plate is moved in a direction apart from the mount surface portion, the contact portions of the contact pin is opened.

4. A socket for an electrical part according to claim 3, wherein when the movable plate is moved in the direction apart from the mount surface portion, said force acting portion of the contact pin is set to be apart from said fulcrum portions.

5. A socket for an electrical part according to claim 1, wherein said press portion to be pressed by the movable plate is formed so as to provide a tapered shape widened towards end portions opposite to the front end portions to which contact portions are formed.

6. A socket for an electrical part according to claim 1, wherein said press portions to be pressed by the movable plate have shapes such that a distance between the press portions of each of the contact pins is made narrow towards the end portion opposite to the front end portion of the contact pin at which the contact portions are formed.

7. A socket for an electrical part according to claim 6, wherein said movable plate is movable in a direction perpendicular to said mount surface portion of the socket body and when the movable plate is moved in a direction approaching to the mount surface portion, the contact portions of the contact pin is opened.

8. A socket for an electrical part according to claim 1, wherein said contact pins are formed through a punching working by means of press from a sheet of plate having an elastic property.

* * * * *

UNITED STATES PATENT AND TRADEMARK OFFICE
CERTIFICATE OF CORRECTION

PATENT NO. : 6,126,467
DATED : October 3, 2000
INVENTOR(S) : Yoshiyuki Ohashi

Page 1 of 1

It is certified that error appears in the above-identified patent and that said Letters Patent is hereby corrected as shown below:

Title page,
Item [30], please delete the following:
"Dec. 18, 1998 [JP] Japan .......10-360650"
"Dec. 25, 1998 [JP] Japan .......10-369388"
"Dec. 28, 1998 [JP] Japan........10-223676".

Signed and Sealed this

Eighteenth Day of December, 2001

Attest:

JAMES E. ROGAN
*Attesting Officer*  *Director of the United States Patent and Trademark Office*